(12) United States Patent
Yu

(10) Patent No.: US 6,480,386 B1
(45) Date of Patent: Nov. 12, 2002

(54) HEAT SINK ASSEMBLY WITH PRESSING WEDGES

(75) Inventor: Hung-Chi Yu, Hsi-Chih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/086,616

(22) Filed: Feb. 28, 2002

(51) Int. Cl.[7] ................................................ H05H 7/20
(52) U.S. Cl. ...................... 361/704; 361/690; 361/719; 165/803; 165/185; 257/719; 257/726; 24/458; 248/510
(58) Field of Search ............................ 24/457–458, 625; 248/505, 510; 257/718–719, 726–727; 165/80.2, 80.3, 188; 361/704, 690, 707, 709–710, 719–721

(56) References Cited

U.S. PATENT DOCUMENTS

| | | | |
|---|---|---|---|
| 5,323,845 A | * 6/1994 | Kin-shon | 165/80.3 |
| 5,329,426 A | * 7/1994 | Villani | 361/719 |
| 5,493,475 A | * 2/1996 | Lin | 361/710 |
| 6,343,017 B1 | * 1/2002 | Yu et al. | 361/704 |
| 6,414,846 B1 | * 7/2002 | Chen | 361/704 |

* cited by examiner

Primary Examiner—Gregory Thompson
(74) Attorney, Agent, or Firm—Wei Te Chung

(57) ABSTRACT

A heat sink assembly includes a mother board (70), a CPU (50), a pair of retention modules (40), a heat sink (30), and a fastener (20). The retention modules are secured to the mother board at opposite sides of the CPU. The heat sink is attached to the CPU. The fastener includes a spring (26), and a pair of wedges (22) engaged at opposite ends of the spring. The fastener engagingly spans across the heat sink. The spring provides the fastener with resiliency, and presses the wedges against the retention modules. The wedges are pressed by the retention modules toward the CPU, thereby pressing the heat sink against the CPU.

20 Claims, 4 Drawing Sheets

HEAT SINK ASSEMBLY WITH PRESSING WEDGES

BACKGROUND OF THE INVENTION

1. Field of the Invention

The present invention relates to heat sink assemblies, and particularly to a heat sink assembly with a fastener which has an elastic element and wedges that enhance attachment of a heat sink to an electronic device.

2. Description of Prior Art

Developments in today's highly information-intensive society have led to remarkable improvements in performances of electronic devices. During operation of many contemporary electronic devices such as central processing units (CPUs), large amounts of heat are produced. Such heat must be quickly removed from the electronic device, to prevent the system from becoming unstable or being damaged. Typically, a heat sink is attached to an outer surface of the device to remove heat therefrom. Various fasteners can be used to attach the heat sink to the device.

An example of a conventional heat sink fastener is disclosed in Taiwan Patent Application No. 87204504. As shown in FIG. 4, the fastener 1 integrally comprises a pressing portion 11, a pair of operating portions 12 extending from opposite ends of the pressing portion 11, and a pair of legs 13 respectively depending from the operating portions 12. Each leg 13 has a catch 131 formed at a bottom end thereof, for engaging in a corresponding aperture defined in a CPU seat. In use, the fastener 1 is placed across a heat sink. One of the catches 131 is engaged in one aperture. The operating portion 12 that is opposite to the engaged catch 131 is depressed, to cause the opposite catch 131 to engage in the other aperture. The heat sink is thus attached to an outer surface of the CPU.

Operation of the fastener 1 is inconvenient, because unduly large force must be exerted on the operation portion 12 opposite to the engaged catch 13. Furthermore, when the fastener 1 is mass-produced, variations in dimensions of the fasteners 1 inevitably exist. Frequently, this results in a discrepancy between dimensions of a fastener 1 and dimensions of the apertures of the CPU seat. The fastener 1 cannot effectively prevent the heat sink from moving relative to the CPU when the combined fastener 1, heat sink and CPU are subjected to vibration or shock during normal use. This adversely affects stability of the heat sink on the CPU, and leads to inefficient heat removal.

An improved means of securing a heat sink to a CPU which overcomes the above-mentioned problems is desired.

BRIEF SUMMARY OF THE INVENTION

Accordingly, an object of the present invention is to provide a heat sink assembly with a fastener which can eliminate relative discrepancies in dimensions to enhance attachment of a heat sink to an electronic device.

Another object of the present invention is to provide a heat sink assembly having efficient heat removal capability.

To achieve the above-mentioned objects, a heat sink assembly of the present invention comprises a mother board, a CPU, a pair of retention modules, a heat sink and a fastener. The retention modules are secured to the mother board at opposite sides of the CPU. The heat s ink is attached to the CPU. The fastener comprises a spring, and a pair of wedges engaged at opposite ends of the spring. The fastener engagingly spans across the heat sink. The spring provides the fastener with resiliency, and presses the wedges against the retention modules. The wedges are pressed by the retention modules toward the CPU, thereby pressing the heat sink against the CPU.

Other objects, advantages and novel features of the present invention will become more apparent from the following detailed description when taken in conjunction with the accompanying drawings.

DETAILED DESCRIPTION OF THE INVENTION

Figure 1:
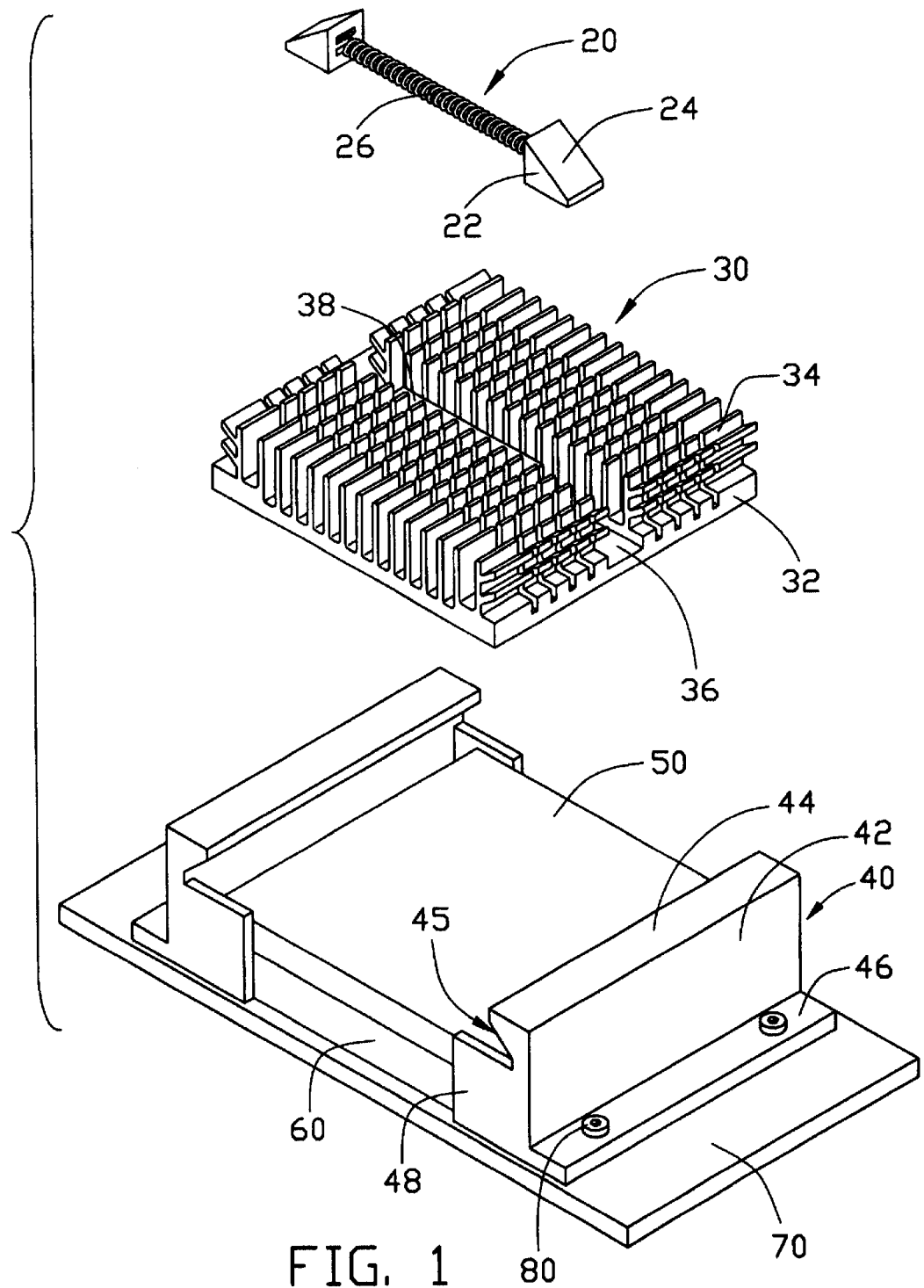
FIG. 1 is an exploded perspective view of a heat sink assembly in accordance with a preferred embodiment of the present invention.

Referring to FIG. 1, a heat sink assembly in accordance with a preferred embodiment of the present invention comprises a fastener 20, a heat sink 30, a mother board 70, a central processing unit (CPU) 50, and a pair of insulative retention modules 40. The CPU 50 is connected to the mother board 70 through a socket 60. The retention modules 40 are positioned on the mother board 70 at respective opposite sides of the CPU 50.

Each retention module 40 comprises a side wall 42, a top wall 44, a bottom wall 46, and a pair of blocking walls 48. The top and bottom walls 44, 46, and blocking walls 48 all extend perpendicularly from the side wall 42. The top and bottom walls 44, 46 are parallel to each other, and perpendicular to the blocking walls 48. The top wall 44 extends from a top end of the side wall 42 in a first direction. A slanted plane 45 is formed at a bottom of the top wall 44. The bottom wall 46 extends from a bottom end of the side wall 42 in a second direction which is opposite to the first direction. The bottom wall 46 defines a pair of through holes (not visible) for insertion of screws 80 therethrough, thereby securing the retention module 40 to the mother board 70. The blocking walls 48 extend from respective opposite side edges of the side wall 42 in the first direction.

The heat sink 30 comprises a base 32, and a plurality of fins 34 extending upwardly from the base 32. A central groove 36 is defined through the fins 34. A tubular portion 38 is formed on the base 32 in the groove 36, in alignment with the groove 36.

The fastener 20 comprises a pair of symmetrically opposite wedges 22, and a helical spring 26 connecting between the wedges 22. A length of the spring 26 is greater than a length of the groove 36 of the heat sink 30. Each wedge 22 has a top inclined plane 24. The inclined plane 24 is highest at an inmost end of the wedge 22, and lowest at an outmost end of the wedge 22.

Figure 2:
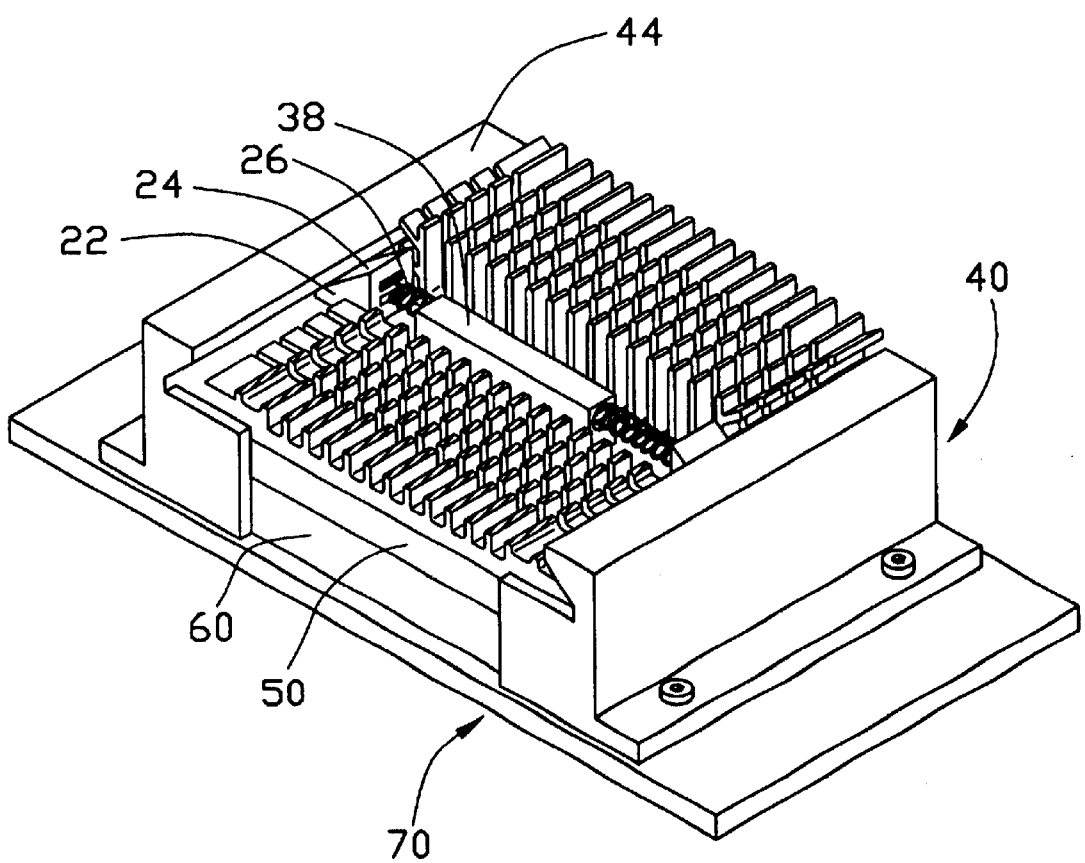
FIG. 2 is an assembled view of FIG. 1, with part of a heat sink of the heat sink assembly cut away for clearer illustration.

Referring also to FIG. 2, in assembly of the heat sink assembly, the CPU 50 is attached to the mother board 70 through the socket 60. The retention modules 40 are secured to the mother board 70, and generally surround the CPU 50. One wedge 22 of the fastener 20 is secured to an end of the spring 26. An opposite end of the spring 26 is extended through the tubular portion 38 of the heat sink 30. The other wedge 22 of the fastener 20 is secured to the opposite end of the spring 26. The wedges 22 are pressed inwardly, and thus the spring 26 is compressed to accommodate the fastener 20 entirely within the groove 36 of the heat sink 30. The combined fastener 20 and heat sink 30 is placed on the CPU 50, with the groove 36 spanning from one retention module 40 to the other retention module 40. The wedges 22 are then released. The spring 26 resiliently expands back toward its original length, and thereby moves the wedges 22 toward the retention modules 40. Each wedge 22 is engagingly sandwiched between the corresponding retention module 40 and the base 32 of the heat sink 30. The inclined planes 24 of wedges 22 are intimately engaged with the slanted planes 45 of the retention modules 40. An appropriate amount of pressure exerted from the retention modules 40 to the wedges 22 toward the CPU 50 is achieved, to thereby cause the wedges 22 to press the heat sink 30 against the CPU 50. Thus, the heat sink 30 can have an intimate contact with the CPU 50.

Figure 3:
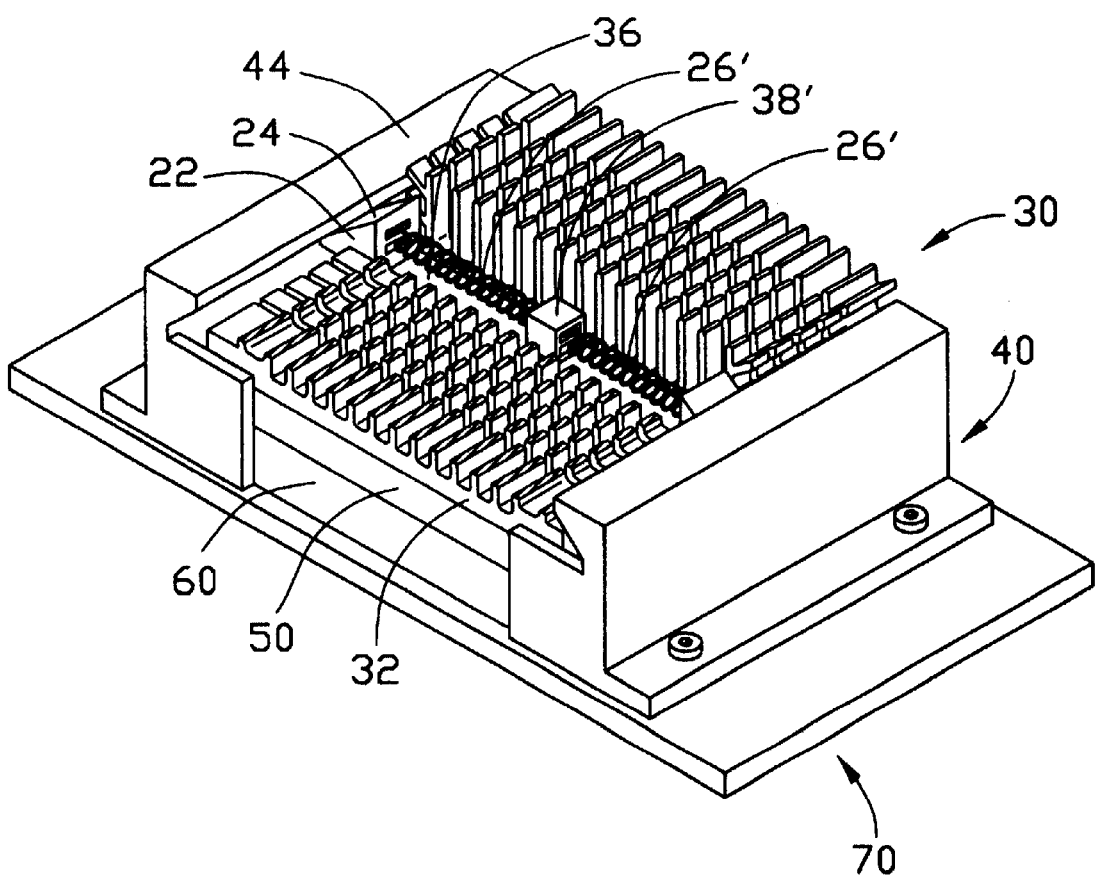
FIG. 3 is an assembled view of a heat sink assembly in accordance with an alternative embodiment of the present invention, with part of a heat sink thereof cut away for clearer illustration.
Figure 4:
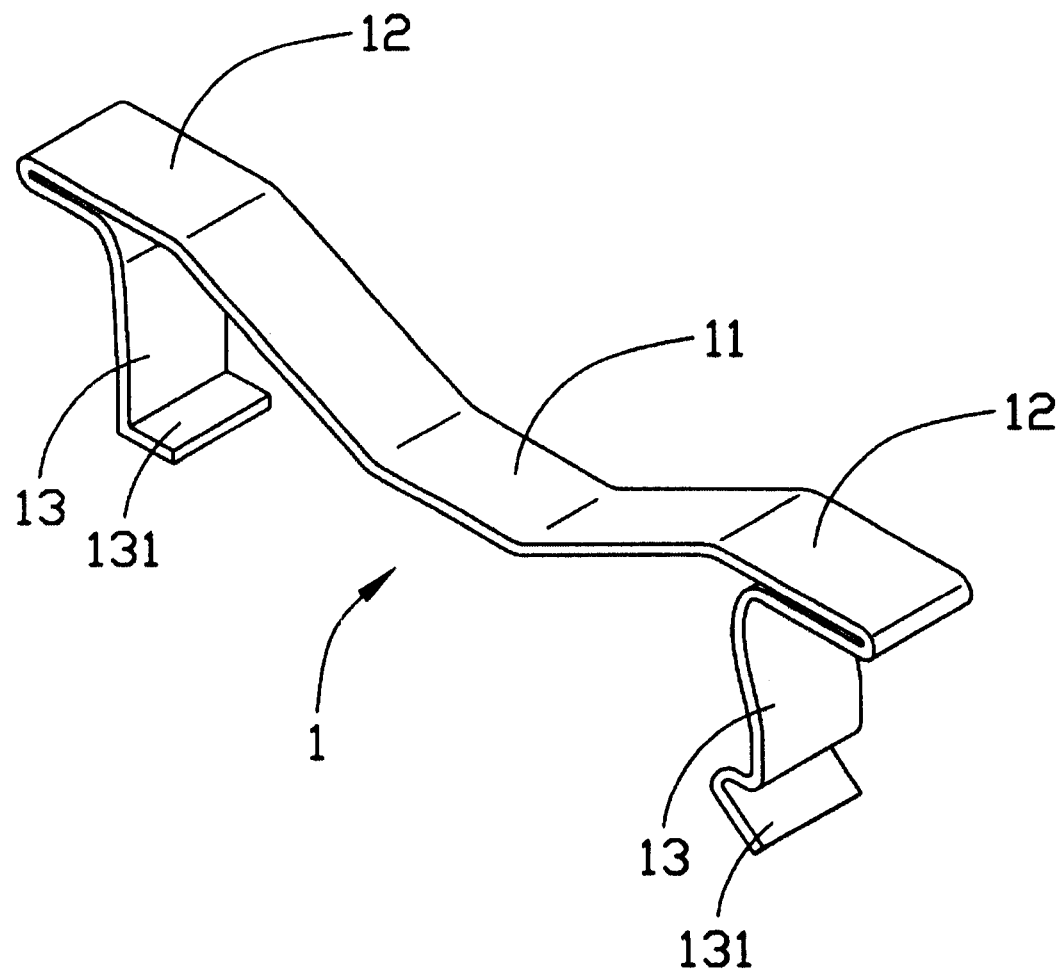
FIG. 4 is a perspective view of a conventional heat sink clip.

Referring to FIG. 3, a heat sink assembly in accordance with an alternative embodiment of the present invention is similar to the heat sink assembly of the preferred embodiment. However, the alternative embodiment has a pair of springs 26' and a connecting portion 38' instead of the spring 26 and tubular portion 38 of the preferred embodiment. The connecting portion 38' is formed on the base 32 of the heat sink 30 in a middle of the central groove 36. The springs 26' are secured to respective opposite sides of the connecting portion 38'. For brevity, a further detailed description of the heat sink assembly of the alternative embodiment is omitted herefrom. Reference is made to the detailed description of the preferred embodiment, with due alteration of details.

In the present invention, the side walls 42 of the retention modules 40 prevent the heat sink 30 from moving in directions parallel to the groove 36. The top walls 44 of the retention modules 40 engagingly depress the wedges 22 evenly, thereby preventing the heat sink 30 from moving in vertical directions. The blocking walls 48 of the retention modules 40 prevent the heat sink 30 from moving in directions perpendicular to the groove 36. The heat sink 30 is therefore stably and intimately secured to the CPU 50. The heat sink 30 can thus attain maximal heat removal capability.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:
a mother board;
an electronic device mounted on the mother board;
a pair of retention modules secured to the mother board and surrounding the electronic device, each of the retention modules having a top wall, the top wall defining a slanted plane on a bottom thereof;
a heat sink attached to the electronic device, the heat sink having a base in contact with the electronic device and a plurality of fins extending from the base; and
a fastener engaged with the heat sink and the retention modules, the fastener comprising a pair of wedges and an elastic element connecting between the wedges, each of the wedges having an inclined plane on a top thereof, the inclined plane being intimately engaged with the slanted plane of a corresponding retention module.

2. The heat sink assembly as described in claim 1, wherein each of the retention modules comprises a side wall for preventing the heat sink from moving in lateral directions.

3. The heat sink assembly as described in claim 1, wherein each of the retention modules comprises a bottom wall, the bottom wall being secured to the mother board.

4. The heat sink assembly as described in claim 1, wherein each of the retention modules comprises a pair of opposite blocking walls for preventing the heat sink from moving in longitudinal directions.

5. The heat sink assembly as described in claim 1, wherein a central groove is defined through the fins of the heat sink, and the retention modules are disposed at opposite ends of the groove.

6. The heat sink assembly as described in claim 5, wherein the elastic element is a spring.

7. The heat sink assembly as described in claim 6, wherein a tubular portion is formed on the base of the heat sink in the groove, and the spring is received in the tubular portion.

8. The heat sink assembly as described in claim 5, wherein the elastic element comprises a pair of springs.

9. The heat sink assembly as described in claim 8, wherein a connecting portion is formed on the base of the heat sink in the groove, and the springs are secured to opposite sides of the connecting portion.

10. A heat sink assembly comprising:
a mother board;
an electronic device mounted on the mother board through a socket;
a pair of retention modules secured to the mother board at opposite sides of the electronic device;
a heat sink attached to a top of the electronic device; and
a fastener engagingly spanning the heat sink, the fastener having opposite ends thereof engagingly sandwiched between the heat sink and the retention modules.

11. The heat sink assembly as described in claim 10, wherein the fastener comprises a central elastic element and a pair of wedges at opposite ends thereof, the elastic element pressing the wedges against the retention modules.

12. The heat sink assembly as described in claim 11, wherein the wedges are sandwiched between the heat sink and the retention modules so that the heat sink is pressed against the electronic device.

13. The heat sink assembly as described in claim 11, wherein the elastic element is at least one spring.

14. The heat sink assembly as described in claim 11, wherein each of the retention modules defines a slanted plane disposed above the electronic device for intimately engaging with a corresponding wedge.

15. The heat sink assembly as described in claim 11, wherein the heat sink comprises a tubular portion formed on a central portion thereof, the elastic element extending through the tubular portion.

16. The heat sink assembly as described in claim 11, wherein the heat sink comprises a connecting portion formed on a central portion thereof.

17. The heat sink assembly as described in claim 16, wherein the elastic element is a pair of springs secured to opposite sides of the connecting portion.

18. A heat sink assembly comprising:
a mother board;

a socket mounted on the mother board;

an electronic component seated upon the socket;

a pair of retention modules mounted on the mother board and about said socket and said electronic component;

a heat sink seated upon the electronic component;

a fastener seated upon the heat sink and having tendency to bring about a horizontal movement to have two opposite ends thereof abut against the corresponding retention modules, respectively, along a lengthwise direction of said fastener; and one guiding structure formed on each of said retention modules to initiate a downward movement of said fastener in response to said horizontal movement so as to result in a downward force to have the heat sink tightly downwardly abut against the electronic component for removing heat generated by said electronic component.

19. The assembly as described in claim 18, wherein said fastener includes a pair of wedges at said two opposite ends thereof.

20. The assembly as described in claim 18, wherein said fastener includes a spring between said two opposite ends to provide said tendency.

\* \* \* \* \*